(12) United States Patent
Tsukahara et al.

(10) Patent No.: US 7,353,600 B2
(45) Date of Patent: Apr. 8, 2008

(54) CIRCUIT BOARD FABRICATION METHOD AND CIRCUIT BOARD

(75) Inventors: Norihito Tsukahara, Kyoto (JP); Kazuhiro Nishikawa, Osaka (JP); Daisuke Sakurai, Toyonaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 486 days.

(21) Appl. No.: 10/940,933

(22) Filed: Sep. 15, 2004

(65) Prior Publication Data

US 2005/0060886 A1    Mar. 24, 2005

(30) Foreign Application Priority Data

Sep. 18, 2003   (JP)   ............... 2003-325846

(51) Int. Cl.
*H05K 3/00*   (2006.01)
*H05K 3/12*   (2006.01)
(52) U.S. Cl. .............. 29/852; 29/846; 29/850; 174/262; 264/319; 264/330
(58) Field of Classification Search ............ 29/846, 29/847, 850, 852; 156/344, 247, 272.2, 275.7; 174/260–264, 266; 264/104, 105, 272.11, 264/272.12, 272.17, 278, 219, DIG. 44, 317, 264/309, 319, 330
See application file for complete search history.

(56) References Cited

FOREIGN PATENT DOCUMENTS

| | | |
|---|---|---|
| JP | 2001-230520 | 8/2001 |
| JP | 2002033562 A * | 1/2002 |
| JP | 2002-076614 | 3/2002 |

OTHER PUBLICATIONS

Machine Translation of JP2002033562.*

* cited by examiner

*Primary Examiner*—Peter Vo
*Assistant Examiner*—Livius R Cazan
(74) *Attorney, Agent, or Firm*—Wenderoth, Lind & Ponack, L.L.P.

(57) ABSTRACT

A circuit board fabrication method including: forming first conductive interconnection 2 onto insulator substrate 1; applying resin film 41, which is to be interlevel insulator layer 42 for electrically insulating first conductive interconnection 2 and second conductive interconnection 6, onto insulator substrate 1; either making pillar-like member 3 stand on a prescribed position on first conductive interconnection 2 before applying resin film 41, or press fitting pillar-like member 3 into resin film 41 so as to reach either a surface vicinity of first conductive interconnection 2 or a portion of first conductive interconnection 2 after applying resin film 41; hardening resin film 41 to form interlevel insulator layer 42; pulling out pillar-like member 3 to form opening 5 in interlevel insulator layer 42; and forming second conductive interconnection 6 onto interlevel insulator layer 42 to include opening 5.

5 Claims, 10 Drawing Sheets

CIRCUIT BOARD FABRICATION METHOD AND CIRCUIT BOARD

TECHNICAL FIELD

The present invention relates to a circuit board fabrication method in which a conductive interconnection and an interlevel insulator layer are formed by a build-up process onto an insulator substrate, and also relates to such a circuit board.

BACKGROUND ART

In recent years, for electronic devices which are required to be small and low-profile like portable terminals, techniques for fabricating multi-layer circuit boards capable of high-density packaging have been being developed. Important technical assignments to fabricate multi-layer circuit boards by a build-up process include: techniques for forming interlevel insulator layers to be laminated in multi-layers; techniques for forming interconnections; and techniques for forming connection conductors between the layers. Above all, it has been expected to develop an inexpensive method for forming a large number of via holes with high precision and filling these via holes with a conductive member.

Via hole formation methods developed include: using laser processing; and forming throughhole conductors by previously providing a surface with conductive projections which are to be via hole conductors, and then pressing softened resin onto the surface.

In recent years, other approaches have been developed. One such approach is to form through holes on prepregs by press working and to laminate the prepregs. Another is to form a resin sheet having through holes therein by pouring resin into a metal mold provided with projections for via hole formation.

To be more specific, Japanese Laid-Open Patent Application No. 2002-76614 discloses a method for forming through holes by heating a top mold having metal pins made to stand thereon at a prescribed pitch up to the melting point of a prepreg, and at the same time, heating the prepreg close to its melting point so as to make the metal pins pierce the prepreg; and raising the top mold after being cooled so as to pull out the metal pins.

Japanese Laid-Open Patent Application No. 2001-230520 discloses a method for forming a resin sheet having through holes therein by pouring molten resin into a metal mold provided with projections, which is what is called injection molding.

This conventional method for forming a resin sheet having through holes therein by injection molding will be described as follows with reference to accompanying drawings. FIGS. 9A to 9C are cross sectional views to depict processes in the conventional method for fabricating a resin sheet having through holes therein.

First of all, as shown in FIG. 9A, bottom mold 101 and top mold 102 are disposed in such a manner that second projections 104 of bottom mold 101 are in contact with top mold 102. Bottom mold 101 is provided with first projections 103 on sites corresponding to trenches in which to form conductive interconnections in a later process, and with second projections 104 on sites corresponding to through holes. Top mold 102 is designed to be flat to fit bottom mold 101. Top mold 102 and bottom mold 101 form a metal mold with cavities. To make a description simple, the cross sectional view shows main components only, while omitting surrounding barrier ribs for forming the mold cavities, a gate through which to pour resin and other components.

Next, as shown in FIG. 9B, resin 105 with thermoplastic or thermosetting properties is heated up to its melting point and poured into the cavities. After the pouring, the metal mold is cooled, and top mold 102 and bottom mold 101 are pulled out of resin 105 to obtain resin sheet 107 having a cross section shown in FIG. 9C. Resin sheet 107 is provided with trenches 108 at sites corresponding to first projections 103 of bottom mold 101, and with through holes 109 at sites corresponding to second projections 104. By filling conductive paste into trenches 108 and through holes 109 and then hardening the paste, resin sheet 107 provided with an interconnection pattern including throughhole conductors can be obtained. Integrally laminating a plurality of resin sheets 107 provided with this interconnection pattern results in a multi-layer circuit board.

However, all conventional methods described above address throughhole formation on a board having no interconnection pattern. It is difficult to form an interlevel insulator film having through holes therein directly onto a board having an interconnection pattern formed therein.

The present invention, which has been contrived to solve the problem of the conventional methods, has an object of providing a circuit board fabrication method in which an interlevel insulator layer having via holes therein can be easily formed onto an insulator substrate having an interconnection pattern formed therein while securing fine pitch interlevel connection, and also providing such a circuit board.

SUMMARY OF THE INVENTION

In order to achieve this object, the present invention is a circuit board fabrication method for forming a circuit board with a multi-layer structure onto an insulator substrate by a build-up process, comprising:

(a) forming a first conductive interconnection onto the insulator substrate;

(b) applying a resin film, which is to be an interlevel insulator layer for electrically insulating the first conductive interconnection and a second conductive interconnection, onto the insulator substrate;

(c) one of making a pillar-like member stand on a prescribed position on the first conductive interconnection before applying the resin film, and press fitting the pillar-like member into the resin film in such a manner as to reach one of a surface vicinity of the first conductive interconnection and a portion of the first conductive interconnection after applying the resin film;

(d) hardening the resin film to form the interlevel insulator layer;

(e) pulling out the pillar-like member to form an opening in the interlevel insulator layer; and (f) forming a second conductive interconnection onto the interlevel insulator layer in such a manner as to include the opening.

After forming up to the second conductive interconnection in accordance with the aforementioned method, the processes from (b) to (f) can be repeated to obtain a multi-layer circuit board having two or more interlevel insulator layers.

By this fabrication method, an opening for interlevel connection can be easily formed in an interlevel insulator layer made of resin by a build-up process. Furthermore, changing the shape of the tip of the pillar-like member allows the opening to be, e.g. tapered, thereby preventing the conductive interconnections provided for interlevel connection from being disconnected in the opening.

The circuit board fabrication method of the present invention enables a multi-layer circuit board to be fabricated by easily forming an opening for interlevel connection, without requiring a complicated process or facility. This method is particularly suitable for small quantity and large variety manufacturing, and therefore can be widely applied to portable terminal devices and the like with a short product cycle.

DETAILED DESCRIPTION OF PREFERRED EMBODIMENTS

The following is a detailed description of embodiments of the present invention with reference to accompanying drawings. Equivalent components will be referred to with the same marks and their description may be omitted.

First Exemplary Embodiment

FIGS. 1A to 1E are cross sectional views to depict processes in a circuit board fabrication method according to a first embodiment of the present invention.

Figure 1A:
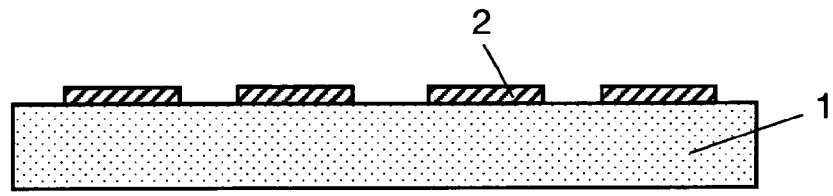
FIGS. 1A to 1E are cross sectional views to depict processes in a circuit board fabrication method according to a first embodiment of the present invention.

First of all, as shown in FIG. 1A, first conductive interconnections 2 are formed on insulator substrate 1. As insulator substrate 1, a hard resin substrate made from glass fabric base epoxy resin or a flexible substrate made from polyimide is often used; however, the material of insulator substrate 1 is not limited to these. First conductive interconnections 2 can be formed by, e.g. printing conductive resin paste and then subjecting the paste to a hardening treatment; however, besides this method, it is also possible to etch copper foil to form a pattern.

Figure 1B:
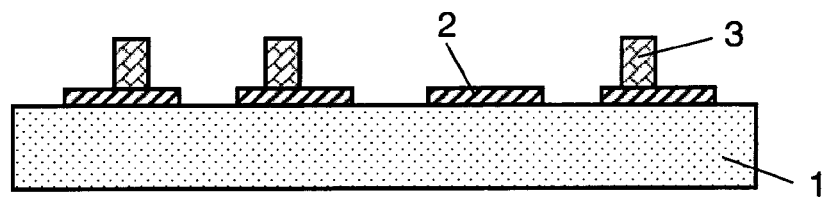

Next, as shown in FIG. 1B, pillar-like members 3 are made to stand on positions on first conductive interconnections 2 that allow pillar-like members 3 to be electrically continuous with second conductive interconnections 6, which will be formed in a later process. Pillar-like members 3 are made from metal, resin, ceramic or the like, and preferably have excellent mold releasability with respect to interlevel insulator layer 42, which will be formed in a later process. As a specific example, pillar-like members 3 made from metal can exhibit excellent releasability by coating their surfaces with fluorine-based resin. In general, materials having water or oil repellency can be used. Pillar-like members 3 are preferably cylindrical, and their cross sectional shape and size can be designed in accordance with the shape of the interlevel connection parts. Interlevel insulator layer 42 has a thickness of about 10 to 50 μm, so that openings which are to be via holes have a depth of 10 to 50 μm, and their diameter is about 100 to 500 μm. In order to achieve such a shape of the openings, pillar-like members 3 are about 100 to 500 μm in diameter and about 10 to 50 μm in height. Consequently, pillar-like members 3 can be made to stand in a stable manner by applying, e.g. sticky material to their surfaces that are supposed to come into contact with first conductive interconnections 2.

Figure 1C:
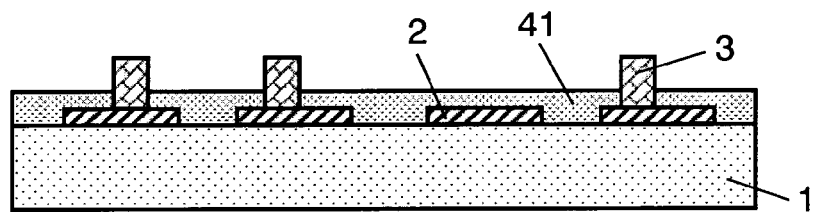

Next, as shown in FIG. 1C, the entire surface of insulator substrate 1 is applied with, e.g. epoxy resin in a low viscosity condition, thereby forming resin film 41. Later, resin film 41 is subjected to a hardening treatment to form interlevel insulator layer 42. Interlevel insulator layer 42 thus hardened has a thickness that allows interlevel insulator layer 42 to securely cover first interconnection conductors 2 and also to be lower than pillar-like members 3 in height. In a case using lowly viscous resin for the formation of resin film 41, it is necessary to provide a wall around insulator substrate 1 so as to prevent the resin from flowing out. Alternatively, it is possible to print insulating paste having adhesiveness, instead of using the lowly viscous resin. Resin film 41 is not limited to epoxy resin. In general, any materials which are used for interlevel insulator film and which can be formed by coating, printing or the like can be used.

Figure 1D:
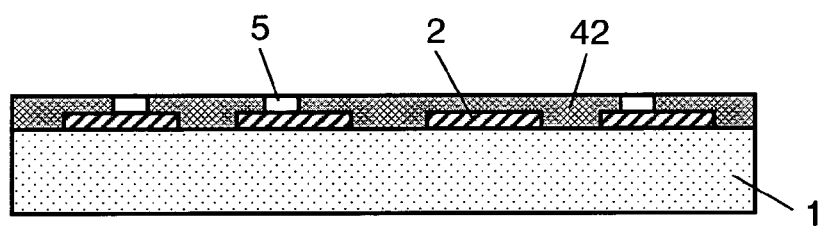

Next, as shown in FIG. 1D, pillar-like members 3 are pulled out of interlevel insulator layer 42 to obtain openings 5. At this moment, some of the resin which is the material of interlevel insulator layer 42 and some of the sticky material may be left on the bottom surfaces of openings 5; however, these residues can be removed by being exposed to plasma containing oxygen, fluorine or the like. During the plasma processing, the surface of interlevel insulator layer 42 is etched as the same time. However, the resin and sticky material left on the bottom surfaces of openings 5 are extremely small in quantity, so that the etching of the surface of interlevel insulator layer 42 during the etching removal of the residues does not cause any problem on interlevel insulator layer 42. To the contrary, interlevel insulator layer 42 can have a roughened surface by the plasma processing, thereby having a better adhesion with second conductive interconnections 6, which will be formed in a later process.

Figure 1E:
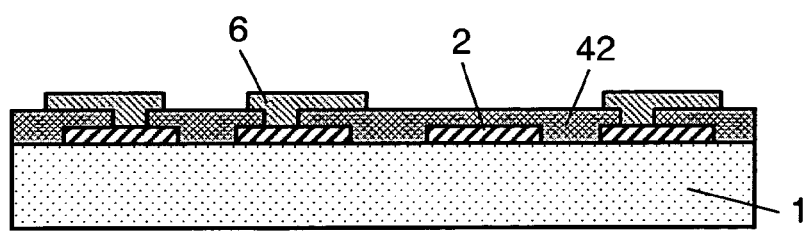

Next, as shown in FIG. 1E, second conductive interconnections 6 are formed in such a manner as to include openings 5. This is done by printing and hardening conductive resin paste. As a result, a circuit board with a two-layer structure is obtained.

Figure 2:
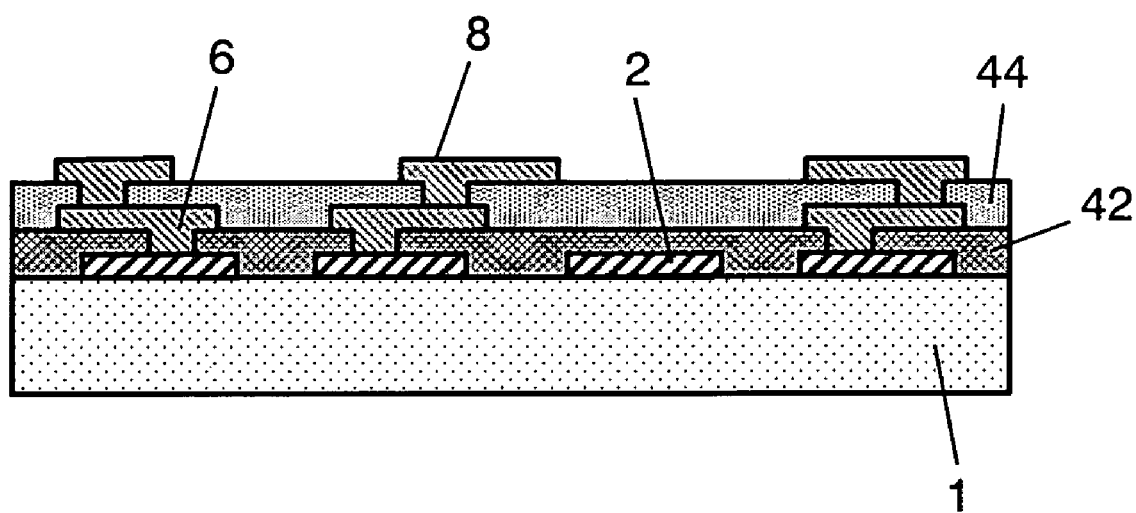
FIG. 2 is a cross sectional view to show an example of a circuit board provided with a larger number of layers according to the circuit board fabrication method of the first embodiment of the present invention.

FIG. 2 is a cross sectional view to show an example of a circuit board provided with a larger number of layers. After forming a circuit board with a two-layer structure as shown in FIG. 1E, the processes shown from FIGS. 1B to 1E are performed one more time to form a circuit board with a three-layer structure. To be more specific, the pillar-like members are made to stand onto second conductive interconnections 6; resin is applied onto the surfaces of second conductive interconnections 6 and interlevel insulator layer 42 to form a resin film; and then the resin film is subjected to a hardening treatment to obtain second interlevel insulator layer 44. Then the pillar-like members are pulled out; a plasma processing is applied; and conductive resin paste is printed and hardened to form third conductive interconnections 8. This results in a circuit board with a three-layer structure.

In the present embodiment, the pillar-like members are made to stand by using sticky material; however, other various methods can be used for this. For example, it is possible to apply temporary adhesive on the tips of the pillar-like members and to put the pillar-like members one by one into sites in which to form the openings. It is also possible to apply conductive adhesive instead of the temporary adhesive, and to put the pillar-like members one by one into sites in which to form the openings. In the latter approach with the conductive adhesive, the plasma processing following the pulling out of the pillar-like members can be omitted.

Furthermore, the sticky material may have the property of losing its stickiness at a temperature to which the resin film is heated to harden. Alternatively, the pillar-like members may be made from light-transmitting material, and the sticky material may be made from material losing its stickiness by light irradiation. The sticky material with the latter-described properties can keep the pillar-like members standing in a stable manner until the applied resin is hardened, and can lose its stickiness by light irradiation when the pillar-like members are pulled out, thereby making the pulling out easy and secure.

It is also possible to use sticky material, which is a three-layer thin sheet including material having normal stickiness or adhesiveness on one side, and material having the property of losing its stickiness by heat or light on the other side. In that case, the adhesion with the pillar-like members is done with the material having normal stickiness, and the adhesion with the first conductive interconnections is done with the material having the property of losing its stickiness by heat or light. With such a structure, the adhesion between the pillar-like members and the first conductive interconnections disappears when the stickiness is lost by light irradiation; however, the sticky layer is kept bonded with the pillar-like members. As a result, the sticky material is less likely to be left on the first conductive interconnection side when the pillar-like members are pulled out, thereby making the plasma processing dispensable.

Thus, the present embodiment can achieve a circuit board fabrication method, not requiring an expensive metal mold and capable of easily addressing a design change.

Second Exemplary Embodiment

FIGS. 3A to 3E are cross sectional views to depict processes in a circuit board fabrication method according to a second embodiment of the present invention. The circuit board fabrication method of the present embodiment is equal to the method of the first embodiment in basic processes, materials and shapes, so that the following description will be mainly focused on points different from the first embodiment.

Figure 3A:
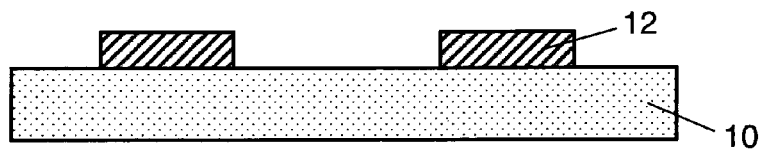
FIGS. 3A to 3E are cross sectional views to depict processes in a circuit board fabrication method according to a second embodiment of the present invention.

First of all, as shown in FIG. 3A, first conductive interconnections 12 are formed on insulator substrate 10. Similar to the first embodiment, as insulator substrate 10, a hard resin substrate made from glass fabric base epoxy resin or a flexible substrate made from polyimide is often used; however, the material of insulator substrate 10 is not limited to these. First conductive interconnections 12 can be formed by, e.g. printing conductive resin paste and subjecting the paste to a hardening treatment; however, the formation of conductive interconnections 12 is not limited to this.

Figure 3B:
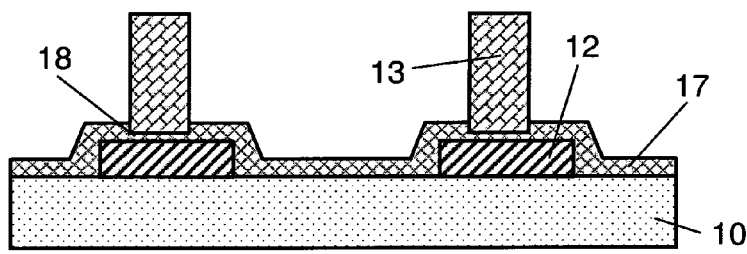

Next, as shown in FIG. 3B, the entire surface of insulator substrate 10 is applied with adhesive layer 17 having an insulating property. Then, pillar-like members 13 are made to stand above positions on first conductive interconnections 12 that allow pillar-like members 13 to be electrically continuous with second conductive interconnections in a later process. Pillar-like members 13 are fixed to first conductive interconnections 12 by adhesive layer 17 present in clearances 18.

Figure 3C:
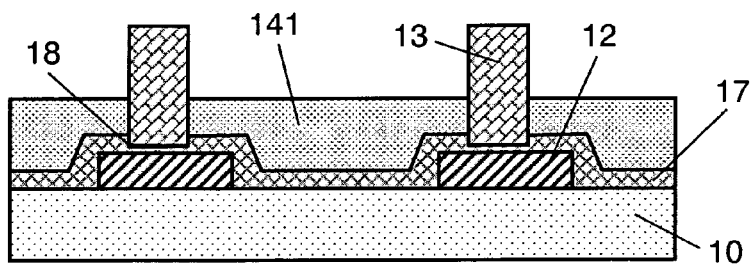

Next, as shown in FIG. 3C, the entire surface of insulator substrate 10 is further applied with lowly viscous resin to form resin film 141. Resin film 141 is heated to harden so as to form interlevel insulator layer 142. Although not shown in FIG. 3C, it is necessary to provide a wall around insulator substrate 10 to prevent the resin from flowing outside.

Figure 3D:
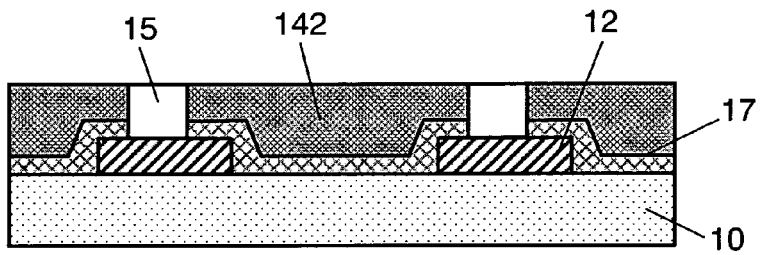

Next, as shown in FIG. 3D, after resin film 141 is hardened to form interlevel insulator layer 142, pillar-like members 13 are pulled out of interlevel insulator layer 142. As a result, interlevel insulator layer 142 is provided with openings 15. At this moment, some of adhesive layer 17 present in clearances 18 may be left on the bottoms of openings 15; however, the residue can be removed by being exposed to plasma containing oxygen, fluorine or the like. During the plasma processing, the surface of interlevel insulator layer 142 is etched as the same time. However, adhesive layer 17 left in clearances 18 is extremely small in quantity, so that the etching of the surface of interlevel insulator layer 142 during the etching removal of the residue does not cause any problem on the function of interlevel insulator layer 142. To the contrary, interlevel insulator layer 142 can have a roughened surface, thereby having a better adhesion with second conductive interconnections 16, which will be formed in a later process.

Figure 3E:
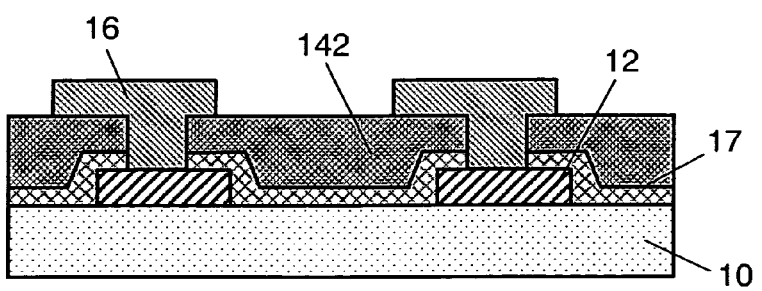

Next, as shown in FIG. 3E, second conductive interconnections 16 are formed in such a manner as to include openings 15. This is done by printing and then hardening conductive resin paste in the same manner as in the first embodiment. As a result, a circuit board with a two-layer structure is obtained.

In a case of fabricating a circuit board provided with a larger number of layers, the processes shown from FIGS. 3B to 3E can be repeated to obtain a circuit board provided with a necessary number of layers.

Although in the present embodiment, as shown in FIG. 3B, adhesive layer 17 is formed onto the entire surface of insulator substrate 10, the present invention is not limited to this structure. To be more specific, adhesive layer 17 can be formed exclusively on regions with which pillar-like members 13 are supposed to come into contact by using screen printing or direct writing method. Providing the surfaces of pillar-like members 13 with excellent mold releasability can facilitate the pulling out of pillar-like members 13. It is also preferable to select, as adhesive layer 17, material having a larger etching rate with respect to plasma such as oxygen, fluorine or the like than with respect to interlevel insulator layer 142. Such material can facilitate the removal of the residue of adhesive layer 17 in clearances 18.

In the present embodiment, pillar-like members 13 are fixed using adhesive layer 17, so that pillar-like members 13 can be kept stably in the process of supplying fluid resin.

Furthermore, selecting as adhesive layer 17 material having excellent adhesion with both insulator substrate 10 and interlevel insulator layer 142 can increase adhesive strength of interlevel insulator layer 142, thereby improving the reliability of the circuit board.

Third Exemplary Embodiment

FIGS. 4A to 4E are cross sectional views to depict processes in a circuit board fabrication method according to a third embodiment of the present invention. The circuit board fabrication method of the present embodiment is also equal to the method of the first embodiment in basic processes, materials and shapes, so that the following description will be mainly focused on points different from the first embodiment.

Figure 4A:
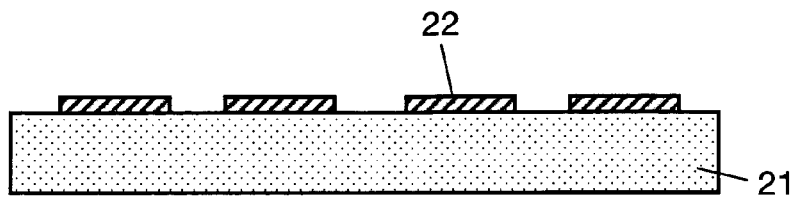
FIGS. 4A to 4E are cross sectional views to depict processes in a circuit board fabrication method according to a third embodiment of the present invention.

First of all, as shown in FIG. 4A, first conductive interconnections 22 are formed on the main surface of insulator substrate 21. First conductive interconnections 22 can be easily formed by printing and then hardening conductive resin paste; however, besides this printing, any other method can be used for the formation of conductive interconnections 22 as in the first embodiment.

Figure 4B:
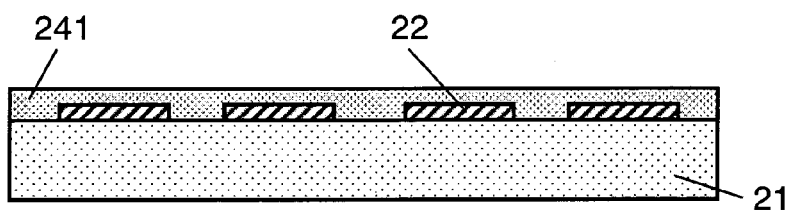

Next, as shown in FIG. 4B, the entire surface of insulator substrate 21 is applied with resin to form resin film 241. The resin applied on the surface of insulator substrate 21 may have a comparatively high viscosity, and can be formed by printing. After being hardened, resin film 241 becomes interlevel insulator layer 242.

Figure 4C:
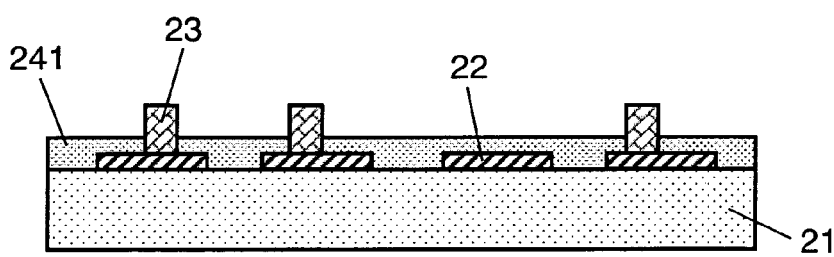

Next, as shown in FIG. 4C, pillar-like members 23 are made to stand on positions on first conductive interconnections 22 where openings are to be formed. In a case of using thermoplastic resin as the material of resin film 241, pillar-like members 23 can be easily press fit and made to stand, after resin film 241 is softened with heat. After this, resin film 241 is hardened to form interlevel insulator layer 242. In a case of using thermosetting resin as the material of resin film 241, pillar-like members 23 can be easily press fit and made to stand while resin film 241 is half-hardened.

Figure 4D:
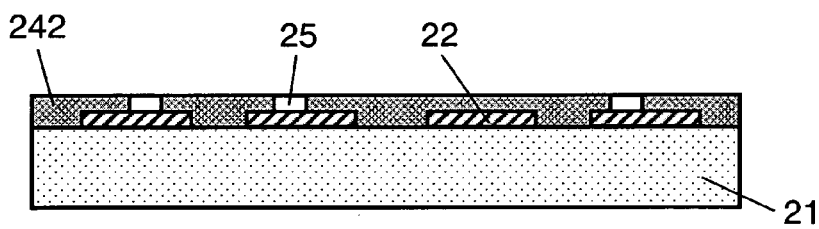

As shown in FIG. 4D, pillar-like members 23 are pulled out of interlevel insulator layer 242 to obtain openings 25. At this moment, some of the resin which is the material of interlevel insulator layer 242 may be left on the bottom surfaces of openings 25. However, the residue can be removed by being exposed to plasma containing oxygen, fluorine or the like. During the plasma processing, the surface of interlevel insulator layer 242 is etched at the same time; however, the resin left on the bottom surfaces of openings is comparatively thin, so that the etching of the surface of interlevel insulator layer 242 during the etching removal of the remaining resin does not cause any problem on the function of interlevel insulator layer 242. To the contrary, interlevel insulator layer 242 can be provided with a roughened surface by the plasma processing, thereby having a better adhesion with second conductive interconnections 26, which will be formed in a later process.

Figure 4E:
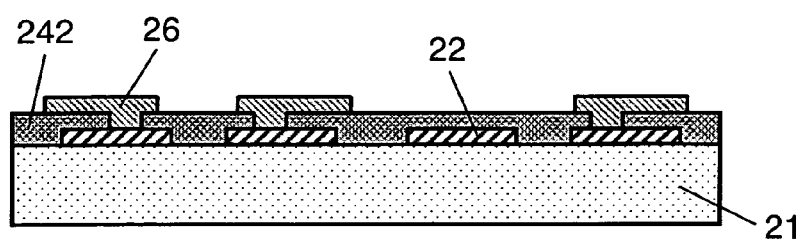

Next, as shown in FIG. 4E, second conductive interconnections 26 are formed in such a manner as to include openings 25. This is done by printing and hardening conductive resin paste. As a result, a circuit board with a two-layer structure is obtained.

In a case of fabricating a circuit board provided with a larger number of layers, the processes shown from FIGS. 4B to 4E can be repeated to obtain a circuit board provided with a necessary number of layers.

In the method of the present embodiment, resin 241 can be selected from various kinds of materials. For example, it can be a thermoplastic resin, a mixture of thermoplastic and thermosetting resins, a mixture of ultraviolet (UV) setting and thermosetting resins, etc. This enables the material of resin 241 to be selected in accordance with the structure of the circuit board, thereby increasing the design flexibility.

For example, in a case of using resin having a photosetting component and a thermosetting component, the following approach is possible: the resin film is subjected to light irradiation to harden the photosetting component while the pillar-like members are made to stand in the rein film. After this, the pillar-like members are pulled out to form openings. It is also possible to thermoset the resin film so as to form an interlevel insulating layer.

This is a two-step hardening treatment in which the photosetting component contained in the resin film is hardened by light while the pillar-like components are made to stand, and then is hardened with heat after the pillar-like components are pulled out. In this method, using pillar-like members made from metal or the like can prevent resin present in the clearances between the pillar-like members and the first conductive interconnections from being radiated with light. In other words, resin in regions not radiated with light is not photoset, but resin in the other regions is radiated with light and photoset. This structure facilitates the pulling out of the pillar-like members, and after the pulling out, no deformation of the openings is caused because the resin film has undergone the first hardening step.

Fourth Exemplary Embodiment

FIGS. 5A to 5F are cross sectional views to depict processes in a circuit board fabrication method according to a fourth embodiment of the present invention.

Figure 5A:
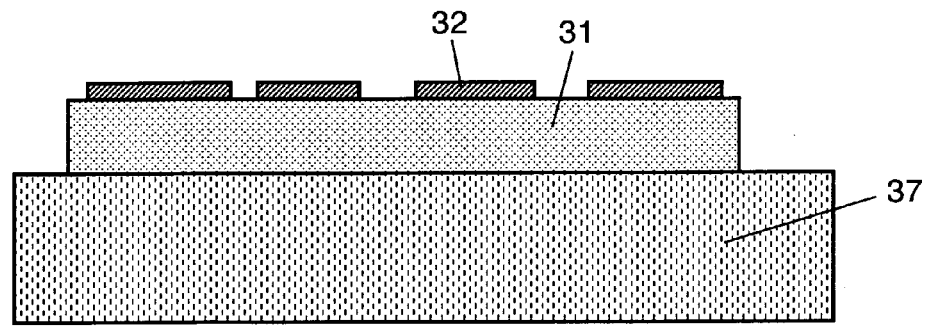
FIGS. 5A to 5F are cross sectional views to depict processes in a circuit board fabrication method according to a fourth embodiment of the present invention.

First of all, as shown in FIG. 5A, first conductive interconnections 32 are formed on insulator substrate 31. As insulator substrate 31, a hard resin substrate made from glass fabric base epoxy resin or a flexible substrate made from polyimide is often used; however, the material of insulator substrate 31 is not limited to these. First conductive interconnections 32 can be formed by, e.g. printing conductive resin paste and subjecting the paste to a hardening treatment; however, besides this method, it is also possible to etch copper foil to form a pattern. Insulator substrate 31 thus provided with first conductive interconnections 32 is placed on first magnetic plate 37 having a magnetic property. Alternatively, it is possible to form first conductive interconnections 32 after placing insulator substrate 31 onto first magnetic plate 37. Magnetic plate 37 preferably has the properties of attracting magnetic material by a magnetic force onto its entire surface and of losing its magnetic force when necessary. In a case of using a permanent magnet, it is only necessary to allow the permanent magnet to change its position. Furthermore, in a case of using an electromagnet, the magnetic force can be easily controlled by turning on and off the current.

Figure 5B:
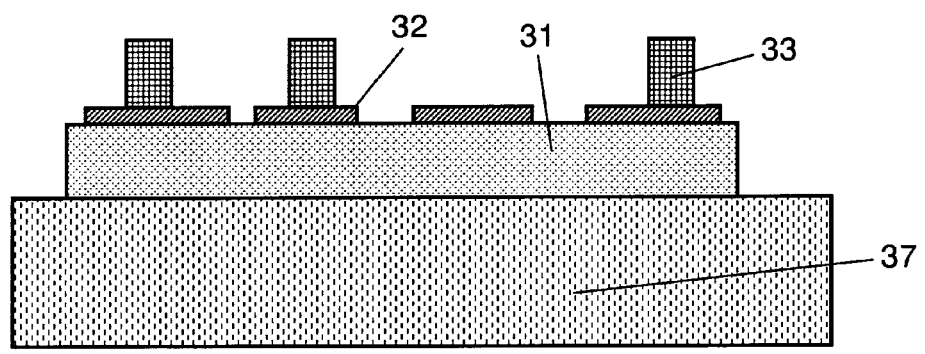

Next, as shown in FIG. 5B, pillar-like members 33 are made to stand on positions on first conductive interconnections 32 that allow pillar-like members 33 to be electrically continuous with second conductive interconnections 36, which will be formed in a later process. Pillar-like members 33 are made from magnetic material such as iron or nickel. It is particularly preferable to use soft magnetic material. The surfaces of pillar-like members 33 preferably have mold releasability with respect to interlevel insulator layer 342, which will be formed in a later process. As a specific example, pillar-like members 33 made of magnetic material can exhibit excellent releasability by coating their surfaces with fluorine-based resin. In general, materials having water or oil repellency can be used.

When arranged on prescribed positions on first conductive interconnections 32, pillar-like members 33 made of magnetic material are fixed on the surfaces of first conductive interconnections 32 by the magnetic force of magnetic plate 37. At this moment, when the magnetic force applied on pillar-like members 33 is large enough, there are substantially no clearances between pillar-like members 33 and first conductive interconnections 32. Consequently, resin applied in these vicinities after the fixation of pillar-like members 33 can be prevented from going into between pillar-like members 33 and first conductive interconnections 32.

Figure 5C:
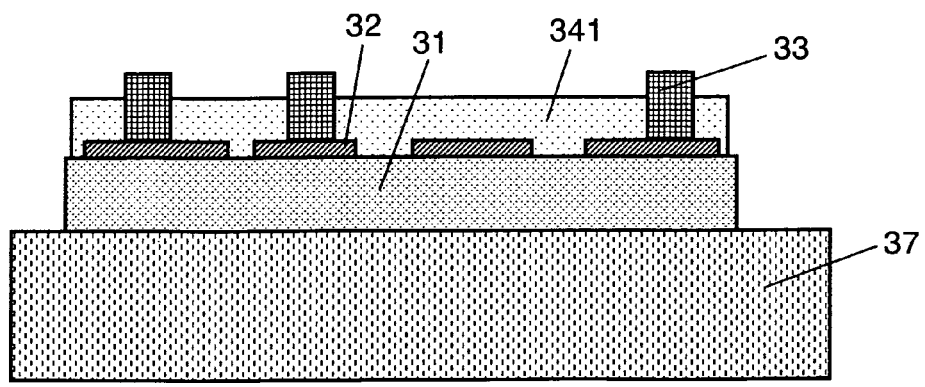

Next, as shown in FIG. 5C, the entire surface of insulator substrate 31 is applied with, e.g. lowly viscous epoxy resin so as to form resin film 341. Later, resin film 341 is hardened to form interlevel insulator layer 342. Interlevel insulator layer 342 has a thickness that allows interlevel insulator layer 342 to securely cover first interconnection conductors 32 and also to be lower than pillar-like members 33 in height. In a case of using lowly viscous resin for the formation of resin film 341, it is necessary to provide a wall around insulator substrate 31. Alternatively, it is possible to print insulating paste having adhesiveness, instead of using the lowly viscous resin. Resin film 341 is not limited to epoxy resin. In general, any materials which are used for interlevel insulator film and which can be formed by coating, printing or the like can be used.

Figure 5D:
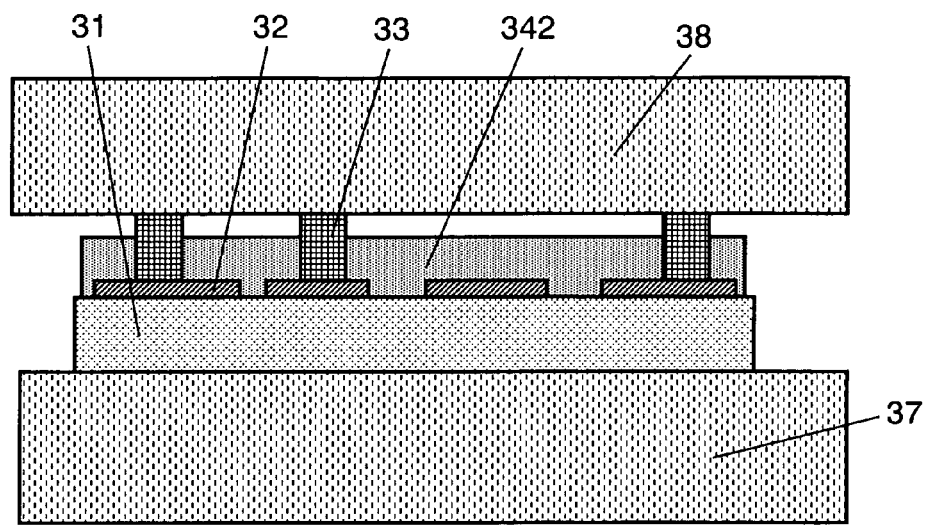

Next, as shown in FIG. 5D, after resin film 341 is hardened to form interlevel insulator layer 342, second magnetic plate 38 is disposed in such a manner as to be in contact with pillar-like members 33. Similar to magnetic plate 37, second magnetic plate 38 also has the properties of attracting a magnetic member by a magnetic force onto its entire surface and of losing its magnetic force when necessary. Second magnetic plate 38 is made to be in contact with pillar-like members 33 and to exert a magnetic force, and at the same time, magnetic plate 37 is made to lose its magnetic force. As a result, pillar-like members 33 are fixed on second magnetic plate 38 by the magnetic force of second magnetic plate 38.

Figure 5E:
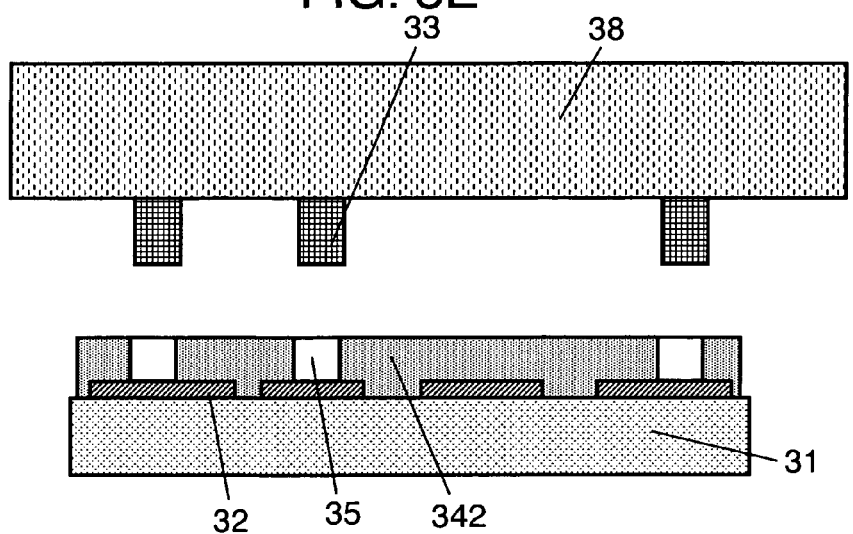

When second magnetic plate 38 is removed in this condition, pillar-like members 33 are pulled out together with second magnetic plate 38 so as to form openings 35 in interlevel insulator layer 342. This condition is shown in FIG. 5E.

In the present embodiment, the magnetic force of first magnetic plate 37 makes pillar-like members 33 and first conductive interconnections 32 be fixed tightly to each other, so that the resin which is the material of interlevel insulator layer 342 is hardly left on the bottom surfaces of openings 35. Therefore, a sufficiently small contact resistance can be achieved without exposing the resin to plasma containing oxygen, fluorine or the like. However, applying plasma processing is preferable in terms of removing stains caused during the processes.

Figure 5F:
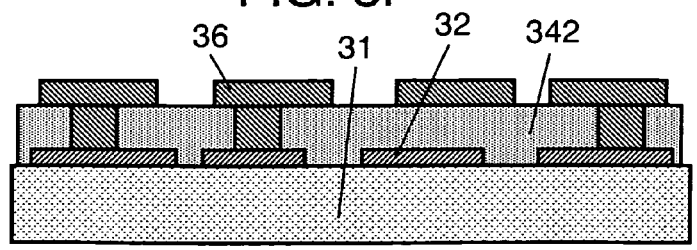

Next, as shown in FIG. 5F, second conductive interconnections 36 are formed in such a manner as to include openings 35. This is done by printing and hardening conductive resin paste. As a result, a circuit board with a two-layer structure is obtained.

In the present embodiment, pillar-like members 33 can be fixed tightly onto first conductive interconnections 32 by the magnetic force, and also can be pulled out collectively by the magnetic force of second magnetic plate 38. In addition, it hardly happens that pillar-like members 33 are displaced during the resin application or other processes. It also hardly happens that the resin goes into the bottoms of openings 35 prepared as described above. These advantages enable openings 35 to be stably prepared by a simple process, and the interlevel connection parts to have fewer variations in the electrical connection resistance, without applying plasma processing.

In a case of fabricating a circuit board provided with a larger number of layers, the processes shown from FIGS. 5B to 5F can be repeated.

Although in the present embodiment, the pillar-like members are pulled out collectively by using the second magnetic plate attracting magnetic members, the present invention is not limited to this structure. After the resin film is hardened to form the interlevel insulator layer, and then the first magnetic plate is made to lose its magnetic force, the pillar-like members can be pulled out individually. Since the pillar-like members are fixed onto the first conductive interconnections by the magnetic force only, it is easy to pull out the pillar-like members when the magnetic force is lost.

The method described in the present embodiment can also be used in the press fitting and fixing of the pillar-like members into the resin in the circuit board fabrication method according to the third embodiment so as to more secure the fixation of the pillar-like members.

In the circuit board fabricating methods according to the first to fourth embodiments, the surfaces of the pillar-like members that are supposed to come into contact with the first conductive interconnections are made flat; however, the present invention is not limited to the shape.

Figure 6A:
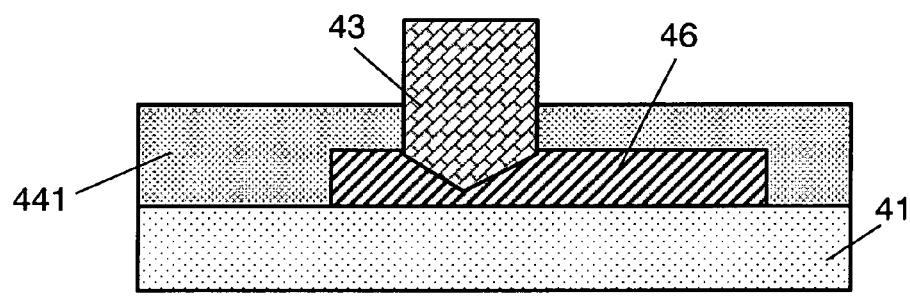
FIGS. 6A to 6C are cross sectional views of main processes in circuit board fabrication using a pillar-like member having a conical surface which is supposed to come into contact with a first conductive interconnection.
Figure 6B:
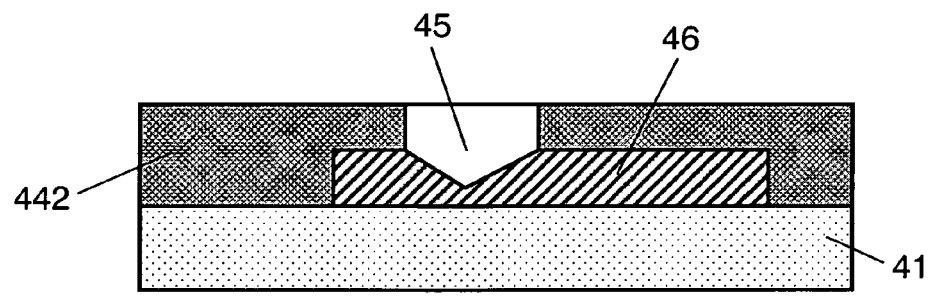
Figure 6C:
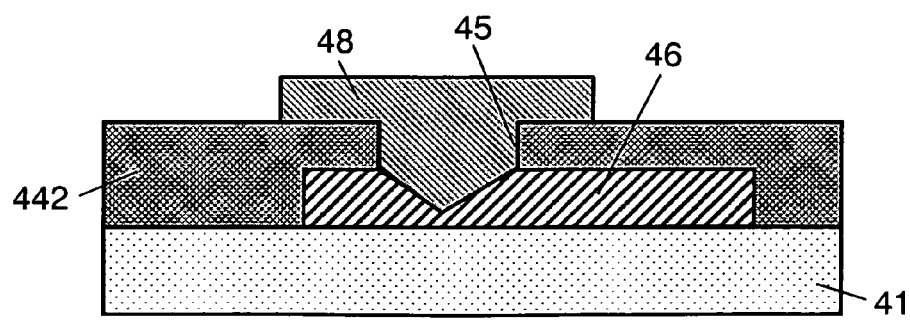

FIGS. 6A to 6C are cross sectional views of main processes in circuit board fabrication using pillar-like members having outward conical tips which are supposed to come into contact with first conductive interconnections. Although these drawings show the vicinity of only one opening, the circuit board has the same structure as those of the first to fourth embodiments.

FIG. 6A is a cross sectional view showing a condition in which after pillar-like member 43 with a conical tip is made to stand on a prescribed position on the surface of first conductive interconnection 46, resin film 441 is applied in such a manner as to have a prescribed thickness. The surface of insulator substrate 41 has first conductive interconnection 46 formed thereon, and pillar-like member 43 is made to stand in such a manner that its tip is partly engaged into first conductive interconnection 46. This press fitting allows pillar-like member 43 to be made to stand stably without providing adhesive or sticky material between pillar-like member 43 and first conductive interconnection 46. Furthermore, since pillar-like member 43 is made to stand by being press fit into first conductive interconnection 46, the resin is prevented from flowing to the press fit region during the formation of resin film 441.

FIG. 6B is a cross sectional view showing a condition in which resin film 441 is subjected to a hardening treatment to form interlevel insulator layer 442, and then pillar-like member 43 is pulled out to form opening 45. On the bottom surface of opening 45 is exposed a surface of first conductive interconnection 46, and no residue of interlevel insulator layer 442 is present.

FIG. 6C is a cross sectional view of a condition in which second conductive interconnection 48 is formed on the surface of interlevel insulator layer 442 in such a manner as to include opening 45, thereby obtaining a circuit board with a two-layer structure.

In fabricating the circuit board in this manner, the tip of pillar-like member 43 is partly engaged into first conductive interconnection 46 so that the resin is prevented from going into the bottom of opening 5, thereby making the plasma processing dispensable. In addition, increasing the contact area between first conductive interconnection 46 and second conductive interconnection could decrease the electrical connection resistance.

Although the tips of the pillar-like members are conical in the above example, they can also be semispherical, multi-pyramid or provided with asperities.

Figure 7A:
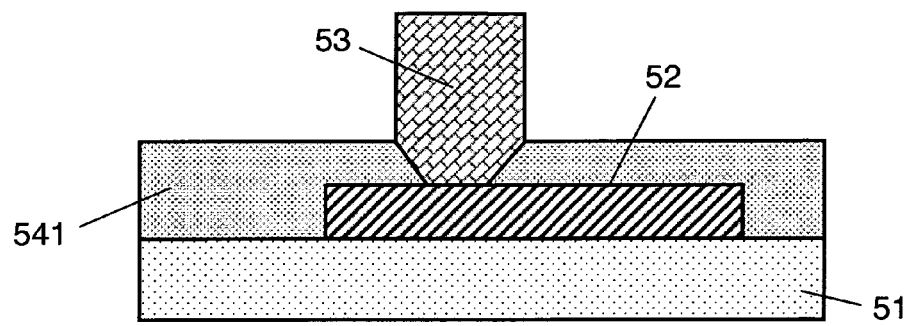
FIGS. 7A to 7C are cross sectional views of main processes in circuit board fabrication using a pillar-like member having a tapered end surface which is supposed to come into contact with a first conductive interconnection.
Figure 7B:
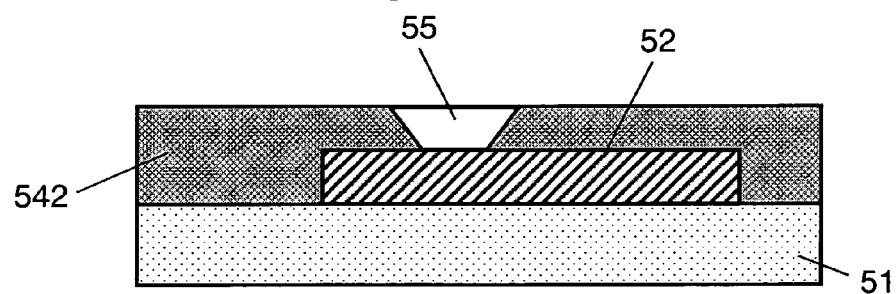
Figure 7C:
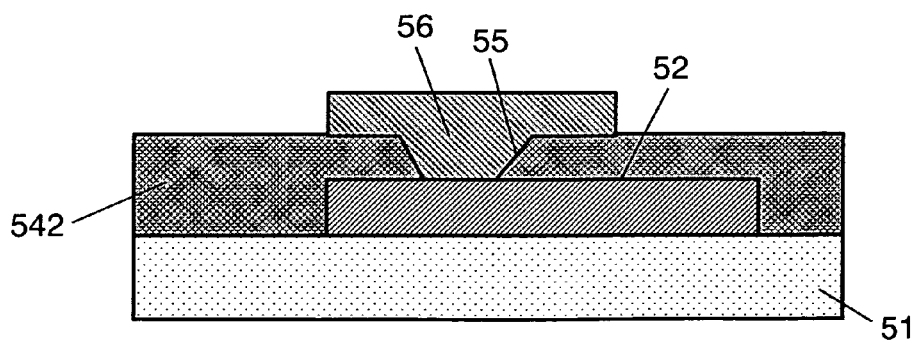

FIGS. 7A to 7C are cross sectional views of main processes in circuit board fabrication using pillar-like members having tapered end surfaces which are supposed to come into contact with first conductive interconnections. Although these drawings show the vicinity of only one opening, the circuit board has the same structure as those of the first to fourth embodiments.

FIG. 7A is a cross sectional view showing a condition where pillar-like member 53 with a tapered tip is made to stand on a prescribed position on the surface of first conductive interconnection 52, and then resin film 541 is applied to have a prescribed thickness. The surface of insulator substrate 51 has first conductive interconnection 52 formed thereon, and pillar-like member 53 is made to stand in such a manner that its flat tip is in contact with first conductive interconnection 52. Pillar-like member 53 can be fixed by providing adhesive or sticky material onto the region with which pillar-like member 53 is supposed to come into contact. Alternatively, it is possible to use a first mount having a magnetic force and a pillar-like member made of magnetic material as described in the fourth embodiment. In this condition, the resin is applied to form resin film 541.

FIG. 7B is a cross sectional view showing a condition in which after resin film 541 is subjected to a hardening treatment to form interlevel insulator layer 542, pillar-like member 53 is pulled out to form opening 55. As shown in the drawing, in the present embodiment, opening 55 is made larger in the top than in the bottom, i.e. tapered.

FIG. 7C is a cross sectional view of a condition in which the surface of interlevel insulator layer 542 has second conductive interconnection 56 formed thereon in such a manner as to include opening 55, thereby obtaining a circuit board with a two-layer structure.

In fabricating the circuit board in this manner, opening 55 with taper can prevent the occurrence of inconveniences such as disconnection during the formation of second conductive interconnection 56.

The taper of the tip of the pillar-like member can be either curved or straight.

Fifth Exemplary Embodiment

Figure 8A:
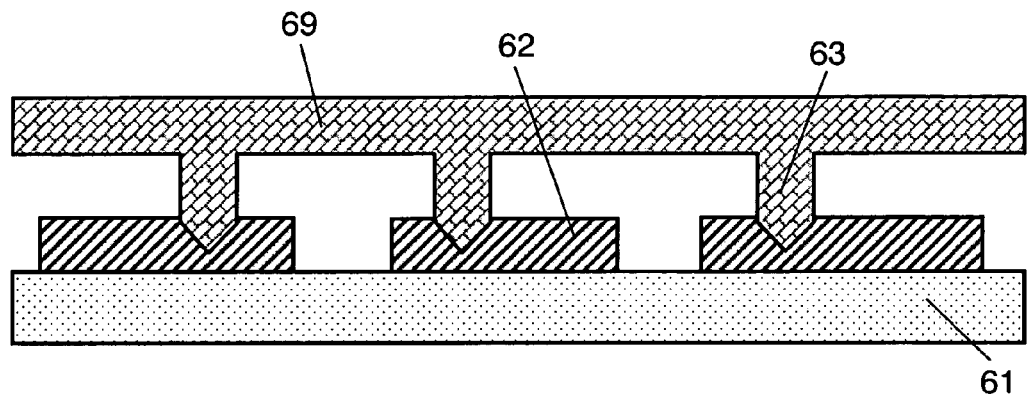
FIGS. 8A to 8C are cross sectional views of main processes in a circuit board fabrication method according to a fifth embodiment of the present invention.
Figure 8B:
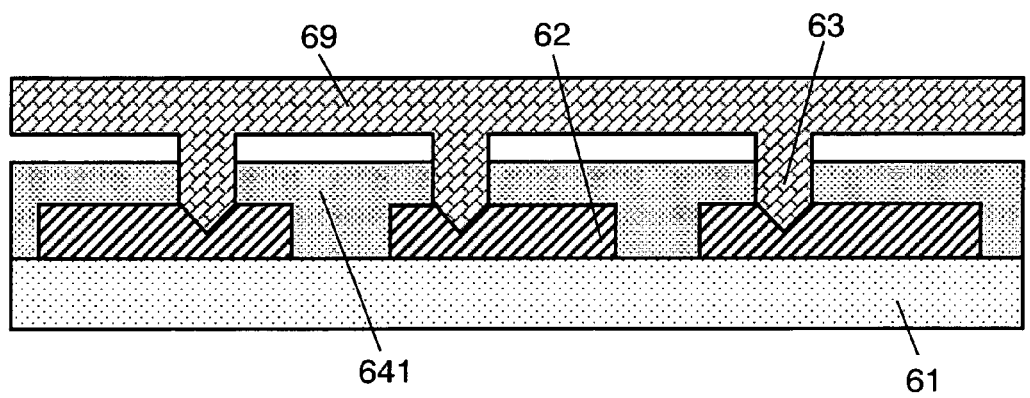
Figure 8C:
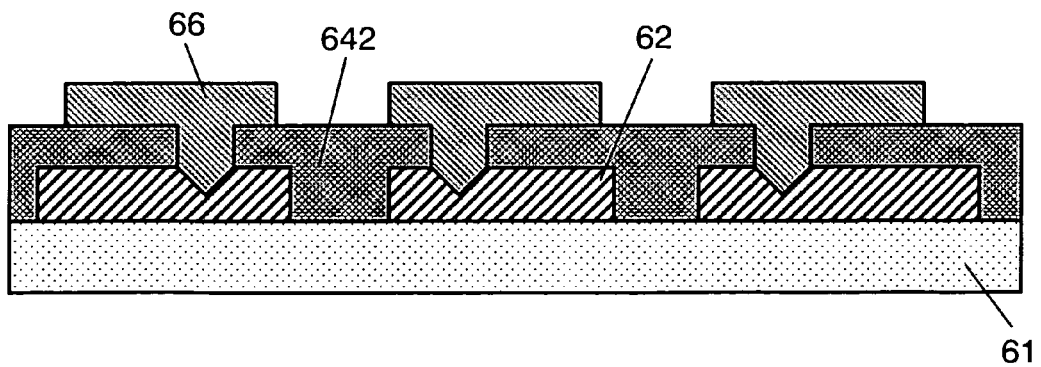
Figure 9A:
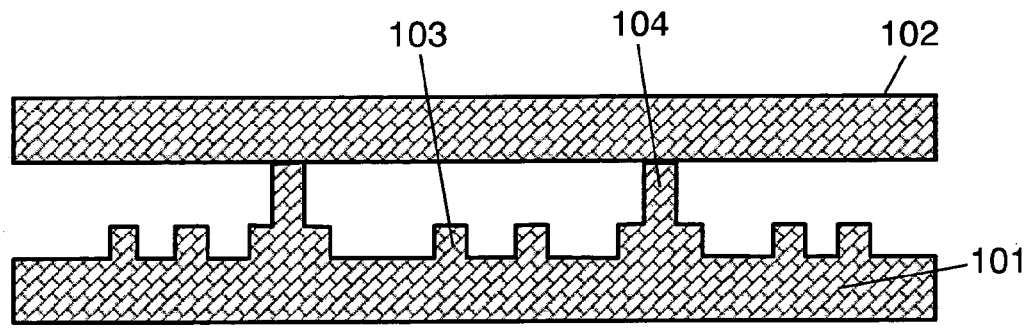
FIGS. 9A to 9C are cross sectional views to depict processes in a conventional method for fabricating a resin sheet having through holes therein by injection molding.
Figure 9B:
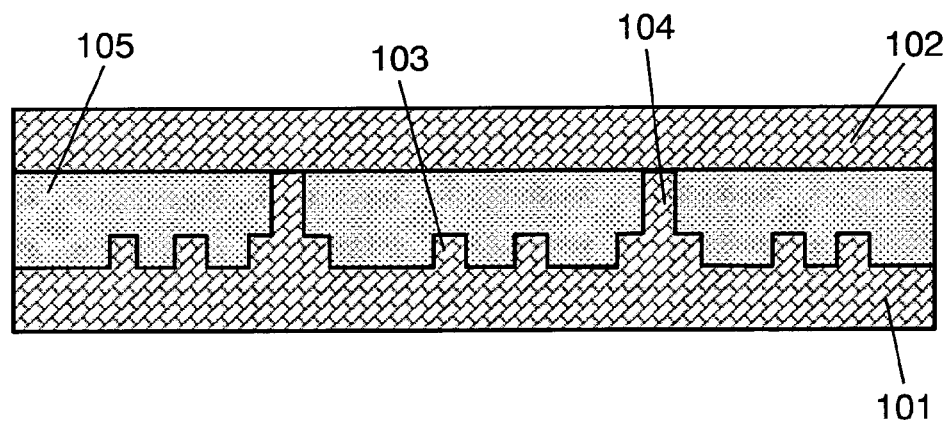
Figure 9C:
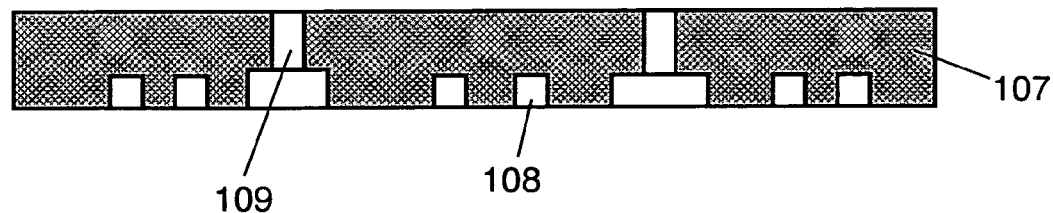

FIGS. 8A to 8C are cross sectional views to depict processes in a circuit board fabrication method according to a fifth embodiment of the present invention. The present embodiment has the feature of linking pillar-like members via a linking plate at their surfaces opposite to the surfaces which are supposed to come into contact with first conductive interconnections. This feature enables the pillar-like members to be made to stand and be pulled out collectively.

FIG. 8A is a cross sectional view showing a condition in which pillar-like members 63 linked via linking plate 69 are collectively made to stand on prescribed positions on first conductive interconnections 62 formed on insulator substrate 61. In the present embodiment, the tips of pillar-like members 63 are awl-shaped, and these awl-shaped tips are press fit and fixed into first conductive interconnections 62.

Although the tips of pillar-like members are awl-shaped in the present embodiment, they can also be conical, semispherical, multi-pyramid, provided with asperities, tapered, flat or the like.

Next, as shown in FIG. 8B, the entire surface of insulator substrate 61 is applied with lowly viscous resin so as to form resin film 641. In this case, insulator substrate 61 is surrounded by a wall to prevent the lowly viscous resin from flowing outside. It is also possible to form an inlet for applying the resin in linking plate 69. Resin film 641 having a prescribed thickness is applied and then hardened to form interlevel insulator layer 642. After the formation of interlevel insulator layer 642, pillar-like members 63 are pulled out collectively to form openings.

Next, as shown in FIG. 8C, second conductive interconnections 66 are formed in such a manner as to include the openings, thereby obtaining a circuit board with a two-layer structure.

In the present embodiment, pillar-like members 63 can be fixed on first conductive interconnections 62 without being individually bonded to first conductive interconnections 62 because pillar-like members 63 are all linked via linking plate 69. In addition, pillar-like members 63 can be made to stand collectively and be pulled out collectively so as to greatly simplify the processes.

Although pillar-like members 63 are made to stand before the formation of resin film 641, it is also possible to harden resin film 641 so as to form interlevel insulator layer 642, after resin film 641 is formed and then pillar-like members 63 are press fit into resin film 641.

The invention claimed is:

1. A circuit board fabrication method for forming a circuit board with a multi-layer structure onto an insulator substrate by a build-up process, comprising:
    (a) forming a first conductive interconnection onto the insulator substrate;
    (b) applying a resin film, which is to be an interlevel insulator layer for electrically insulating the first conductive interconnection and a second conductive interconnection, onto the insulator substrate;
    (c) making a pillar-like member stand on a prescribed position on the first conductive interconnection before applying the resin film by fixing the pillar-like member by providing one of a sticky layer and an adhesive layer between the first conductive interconnection and the pillar-like member;
    (d) hardening the resin film to form the interlevel insulator layer;
    (e) pulling out the pillar-like member to form an opening in the interlevel insulator layer; and
    (f) forming a second conductive interconnection onto the interlevel insulator layer in such a manner as to include the opening.

2. The circuit board fabrication method according to claim 1, wherein
    after forming the second conductive interconnection, processes from (b) to (f) are repeated to provide a multi-layer structure having at least two interlevel insulator layers.

3. The circuit board fabrication method according to claim 1, wherein
    the adhesive layer is formed on a region including the prescribed position on the first conductive interconnection before applying the resin film.

4. The circuit board fabrication method according to claim 1, wherein
the adhesive layer is formed on a surface of the pillar-like member that is supposed to come into contact with the first conductive interconnection.

5. The circuit board fabrication method according to claim 1, wherein
the pillar-like member is made from light-transmitting material;
the sticky layer is made from material losing stickiness thereof by light irradiation, and is formed on a surface of the pillar-like member that is supposed to come into contact with the first conductive interconnection; and after the interlevel insulator layer is formed by hardening the resin film, the sticky layer is exposed to light via the pillar-like member so as to make stickiness of the sticky layer disappear, and then the pillar-like member is pulled out to form the opening in the interlevel insulator layer.

* * * * *